United States Patent
Heley et al.

(10) Patent No.: US 9,185,835 B2
(45) Date of Patent: Nov. 10, 2015

(54) TECHNIQUES FOR MARKING PRODUCT HOUSINGS

(71) Applicant: Apple Inc., Cupertino, CA (US)

(72) Inventors: Richard Walter Heley, Palo Alto, CA (US); Erming Luo, Cupertino, CA (US); Adam Mittleman, San Fancisco, CA (US); John Payne, San Jose, CA (US); Tang Yew Tan, San Francisco, CA (US); Erik Wang, Redwood City, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 13/746,603

(22) Filed: Jan. 22, 2013

(65) Prior Publication Data
US 2013/0129986 A1    May 23, 2013

Related U.S. Application Data

(62) Division of application No. 12/475,597, filed on May 31, 2009, now Pat. No. 8,367,304.

(60) Provisional application No. 61/059,789, filed on Jun. 8, 2008, provisional application No. 61/121,491, filed on Dec. 10, 2008.

(51) Int. Cl.
*G03F 7/26* (2006.01)
*H05K 13/00* (2006.01)
*G03F 7/20* (2006.01)

(52) U.S. Cl.
CPC *H05K 13/00* (2013.01); *G03F 7/20* (2013.01); *G03F 7/2014* (2013.01); *G03F 7/202* (2013.01); *G03F 7/2016* (2013.01); *Y10T 428/2462* (2015.01)

(58) Field of Classification Search
CPC ............ G03F 7/20; G03F 7/2014; G03F 7/26
USPC ...................... 430/10, 16, 322, 324
See application file for complete search history.

(56) References Cited

U.S. PATENT DOCUMENTS

| | | |
|---|---|---|
| 2,647,079 A | 7/1953 | Burnham |
| 2,812,295 A | 11/1957 | Patrick |

(Continued)

FOREIGN PATENT DOCUMENTS

| | | |
|---|---|---|
| CN | 201044438 Y | 2/2008 |
| CN | 102173242 A | 9/2011 |

(Continued)

OTHER PUBLICATIONS

U.S. Appl. No. 12/234,437, entitled "Method and Systems for Forming Housings from Multi-Layer Materials", filed Sep. 19, 2008.

(Continued)

*Primary Examiner* — Kathleen Duda

(57) ABSTRACT

Techniques or processes for providing markings on products are disclosed. The markings provided on products can be textual and/or graphic. The techniques or processes can provide high resolution markings on surfaces that are flat or curved. In one embodiment, the products have housings and the markings are to be provided on the housings. For example, the housing for a particular product can include an outer housing surface and the markings can be provided on the outer housing surface.

26 Claims, 8 Drawing Sheets

(56) References Cited

U.S. PATENT DOCUMENTS

| | | | |
|---|---|---|---|
| 2,990,304 A | 6/1961 | Cybriwsky et al. | |
| 3,216,866 A | 11/1965 | Orlin | |
| 3,526,694 A | 9/1970 | Lemelson | |
| 3,615,432 A | 10/1971 | Jenkins et al. | |
| 3,645,777 A | 2/1972 | Sierad | |
| RE28,225 E | 11/1974 | Heseltine et al. | |
| 4,247,600 A | 1/1981 | Adachi et al. | |
| 4,269,947 A | 5/1981 | Inata et al. | |
| 4,347,428 A | 8/1982 | Conrad et al. | |
| 4,531,705 A | 7/1985 | Nakagawa et al. | |
| 4,547,649 A | 10/1985 | Butt et al. | |
| 4,564,001 A | 1/1986 | Maeda | |
| 4,651,453 A | 3/1987 | Doyle | |
| 4,686,352 A | 8/1987 | Nawrot et al. | |
| 4,756,771 A | 7/1988 | Brodalla et al. | |
| 4,931,366 A | 6/1990 | Mullaney | |
| 4,993,148 A | 2/1991 | Adachi et al. | |
| 5,215,864 A | 6/1993 | Laakmann | |
| 5,224,197 A | 6/1993 | Zanoni et al. | |
| 5,288,344 A | 2/1994 | Peker et al. | |
| 5,417,905 A | 5/1995 | Lemaire et al. | |
| 5,645,964 A | 7/1997 | Nohr et al. | |
| 5,719,379 A | 2/1998 | Huang et al. | |
| 5,744,270 A * | 4/1998 | Pearlman et al. ............ 430/25 | |
| 5,789,466 A | 8/1998 | Birmingham et al. | |
| 5,808,268 A | 9/1998 | Balz | |
| 5,837,086 A | 11/1998 | Leeb et al. | |
| 5,872,699 A | 2/1999 | Nishii et al. | |
| 5,925,847 A | 7/1999 | Rademacher et al. | |
| 5,943,799 A | 8/1999 | Xu et al. | |
| 5,971,617 A | 10/1999 | Woelki et al. | |
| 6,007,929 A | 12/1999 | Robertson et al. | |
| 6,101,372 A | 8/2000 | Kubo | |
| 6,169,266 B1 | 1/2001 | Hughes | |
| 6,325,868 B1 | 12/2001 | Kim et al. | |
| 6,331,239 B1 | 12/2001 | Shirota et al. | |
| 6,480,397 B1 | 11/2002 | Hsu et al. | |
| 6,540,867 B1 | 4/2003 | Cochran | |
| 6,574,096 B1 | 6/2003 | Difonzo et al. | |
| 6,590,183 B1 | 7/2003 | Yeo | |
| 6,633,019 B1 | 10/2003 | Gray | |
| 6,746,724 B1 | 6/2004 | Robertson et al. | |
| 6,802,952 B2 | 10/2004 | Hsu et al. | |
| 6,821,305 B2 | 11/2004 | Yan | |
| 6,966,133 B2 | 11/2005 | Krings et al. | |
| 6,996,425 B2 | 2/2006 | Watanabe | |
| 7,065,820 B2 | 6/2006 | Meschter | |
| 7,134,198 B2 | 11/2006 | Nakatani et al. | |
| 7,181,172 B2 | 2/2007 | Sullivan et al. | |
| 7,225,529 B2 | 6/2007 | Wang | |
| 7,284,396 B2 | 10/2007 | Barron et al. | |
| 7,459,373 B2 | 12/2008 | Yoo | |
| 7,508,644 B2 | 3/2009 | Cheung et al. | |
| 7,530,491 B2 | 5/2009 | Lasch et al. | |
| 7,622,183 B2 | 11/2009 | Shirai et al. | |
| 7,636,974 B2 | 12/2009 | Meschter et al. | |
| 7,691,189 B2 | 4/2010 | En et al. | |
| 8,192,815 B2 | 6/2012 | Weber et al. | |
| 8,367,304 B2 | 2/2013 | Heley et al. | |
| 8,379,678 B2 | 2/2013 | Zhang et al. | |
| 8,379,679 B2 | 2/2013 | Zhang et al. | |
| 8,451,873 B2 | 5/2013 | Zhang | |
| 8,663,806 B2 | 3/2014 | Weber et al. | |
| 8,879,266 B2 | 11/2014 | Jarvis et al. | |
| 2001/0030002 A1 | 10/2001 | Zheng et al. | |
| 2002/0058737 A1 | 5/2002 | Nishiwaki et al. | |
| 2002/0097440 A1 | 7/2002 | Paricio | |
| 2002/0109134 A1 | 8/2002 | Iwasaki et al. | |
| 2002/0130441 A1 | 9/2002 | Robinson et al. | |
| 2002/0160145 A1 | 10/2002 | Bauhoff | |
| 2003/0006217 A1 | 1/2003 | Dance | |
| 2003/0024898 A1 | 2/2003 | Natsume et al. | |
| 2003/0074814 A1 | 4/2003 | Krings et al. | |
| 2004/0000490 A1 | 1/2004 | Chang | |
| 2005/0023022 A1 | 2/2005 | Kriege et al. | |
| 2005/0034301 A1 | 2/2005 | Wang | |
| 2005/0115840 A1 | 6/2005 | Dolan | |
| 2005/0127123 A1 | 6/2005 | Smithers | |
| 2005/0158576 A1 | 7/2005 | Groll | |
| 2005/0211680 A1 | 9/2005 | Li et al. | |
| 2005/0263418 A1 | 12/2005 | Bastus Cortes | |
| 2006/0055084 A1 | 3/2006 | Yamaguchi et al. | |
| 2006/0066771 A1 | 3/2006 | Hayano et al. | |
| 2006/0105542 A1 | 5/2006 | Yoo | |
| 2006/0225918 A1 | 10/2006 | Chinda et al. | |
| 2007/0018817 A1 | 1/2007 | Marmaropoulos et al. | |
| 2007/0045893 A1 | 3/2007 | Asthana et al. | |
| 2007/0053504 A1 | 3/2007 | Sato et al. | |
| 2007/0262062 A1 | 11/2007 | Guth | |
| 2007/0275263 A1 | 11/2007 | Groll | |
| 2008/0085402 A1 * | 4/2008 | Leininger ............ 428/200 | |
| 2008/0105960 A1 | 5/2008 | See et al. | |
| 2008/0152859 A1 | 6/2008 | Nagal | |
| 2008/0165485 A1 | 7/2008 | Zadesky et al. | |
| 2008/0166007 A1 | 7/2008 | Hankey | |
| 2008/0216926 A1 | 9/2008 | Guo et al. | |
| 2008/0241478 A1 | 10/2008 | Costin et al. | |
| 2008/0274375 A1 | 11/2008 | Ng et al. | |
| 2008/0295263 A1 | 12/2008 | Meschter et al. | |
| 2008/0299408 A1 | 12/2008 | Guo et al. | |
| 2008/0311369 A1 | 12/2008 | Yokoyama et al. | |
| 2009/0017242 A1 | 1/2009 | Weber et al. | |
| 2009/0019737 A1 | 1/2009 | Moreno | |
| 2009/0091879 A1 | 4/2009 | Lim | |
| 2009/0104949 A1 | 4/2009 | Sato et al. | |
| 2009/0190290 A1 | 7/2009 | Lynch et al. | |
| 2009/0194444 A1 | 8/2009 | Jones | |
| 2009/0197116 A1 | 8/2009 | Cheng et al. | |
| 2009/0236143 A1 | 9/2009 | Nakamura | |
| 2009/0260871 A1 | 10/2009 | Weber et al. | |
| 2009/0305168 A1 | 12/2009 | Heley et al. | |
| 2010/0015578 A1 | 1/2010 | Falsafi et al. | |
| 2010/0061030 A1 | 3/2010 | Sanford et al. | |
| 2010/0061039 A1 | 3/2010 | Sanford et al. | |
| 2010/0065313 A1 | 3/2010 | Takeuchi et al. | |
| 2010/0159273 A1 | 6/2010 | Filson et al. | |
| 2010/0183869 A1 | 7/2010 | Lin et al. | |
| 2010/0209721 A1 | 8/2010 | Irikura et al. | |
| 2010/0209731 A1 | 8/2010 | Hamano | |
| 2010/0294426 A1 | 11/2010 | Nashner | |
| 2010/0300909 A1 | 12/2010 | Hung | |
| 2011/0008618 A1 | 1/2011 | Weedlun | |
| 2011/0048755 A1 | 3/2011 | Su et al. | |
| 2011/0051337 A1 | 3/2011 | Weber et al. | |
| 2011/0089039 A1 | 4/2011 | Nashner et al. | |
| 2011/0089067 A1 | 4/2011 | Scott et al. | |
| 2011/0123737 A1 | 5/2011 | Nashner et al. | |
| 2011/0186455 A1 | 8/2011 | Du et al. | |
| 2011/0193928 A1 | 8/2011 | Zhang | |
| 2011/0193929 A1 | 8/2011 | Zhang et al. | |
| 2011/0194574 A1 | 8/2011 | Zhang et al. | |
| 2011/0253411 A1 | 10/2011 | Hum et al. | |
| 2011/0315667 A1 | 12/2011 | Reichenback et al. | |
| 2012/0043306 A1 | 2/2012 | Howerton et al. | |
| 2012/0081830 A1 | 4/2012 | Yeates et al. | |
| 2012/0100348 A1 | 4/2012 | Brokhyser et al. | |
| 2012/0248001 A1 | 10/2012 | Nashner | |
| 2012/0275130 A1 | 11/2012 | Hsu et al. | |
| 2013/0075126 A1 | 3/2013 | Nashner et al. | |
| 2013/0083500 A1 | 4/2013 | Prest et al. | |
| 2013/0129986 A1 | 5/2013 | Heley et al. | |
| 2014/0009873 A1 | 1/2014 | Nashner | |
| 2014/0134429 A1 | 5/2014 | Weber et al. | |

FOREIGN PATENT DOCUMENTS

| | | |
|---|---|---|
| DE | 195 23 112 | 6/1996 |
| DE | 102005048870 A1 | 4/2007 |
| EP | 0031463 | 7/1981 |
| EP | 0 114 565 A1 | 8/1984 |
| EP | 121150 A1 | 10/1984 |
| EP | 0234121 | 9/1987 |
| EP | 0 633 585 A | 1/1995 |
| EP | 0 997 958 A1 | 5/2000 |

(56) References Cited

FOREIGN PATENT DOCUMENTS

| | | |
|---|---|---|
| EP | 2 399 740 A1 | 12/2011 |
| EP | 2488369 B1 | 3/2014 |
| GB | 788 329 A | 12/1957 |
| JP | 57-149491 A | 9/1982 |
| JP | 03 013331 A | 1/1991 |
| JP | 03 138131 A | 6/1991 |
| JP | 3-203694 A | 9/1991 |
| JP | 06-126192 | 5/1994 |
| JP | H06-212451 | 8/1994 |
| JP | 06-320104 | 11/1994 |
| JP | 7-204871 A | 8/1995 |
| JP | 2000-000167 | 1/2000 |
| JP | 2003055794 | 2/2003 |
| JP | A2006-138002 | 6/2006 |
| JP | 2008 087409 A | 4/2008 |
| WO | WO 98/53451 | 11/1998 |
| WO | WO 0077883 | 12/2000 |
| WO | WO 01/15916 A1 | 3/2001 |
| WO | WO 01/34408 | 5/2001 |
| WO | WO 2006/124279 A2 | 11/2006 |
| WO | WO 2007/088233 A1 | 8/2007 |
| WO | WO 2008/092949 A1 | 8/2008 |
| WO | WO 2009/051218 A1 | 4/2009 |
| WO | WO 2010/095747 A1 | 8/2010 |
| WO | WO 2010/111798 A1 | 10/2010 |
| WO | WO 2010/135415 | 11/2010 |
| WO | WO2010/135415 A2 | 11/2010 |
| WO | WO 2011/047325 A1 | 4/2011 |

OTHER PUBLICATIONS

Annerfors et al., "Nano Molding Technology on Cosmetic Aluminum Parts in Mobile Phones", Division of Production and Materials Engineering, LTH, 2007.

"Thermal Shock Resistant Conformal Coating", Product Data Sheet, Dymax Corporation, Jul. 9, 2007, pp. 1-2.

"Marking Lasers: Marking without Limitations", Trumpf Inc., Sep. 10, 2007, pp. 1-36.

Communication Relating to the Results of the Partial International Search for PCT/US2009/061883 Apr. 7, 2010.

International Preliminary Report for International Application No. PCT/US2009/061883, mailed Jun. 23, 2011.

European Search Report for European Patent Application No. 09802048.0, dated Aug. 3, 2011.

"UV-Curing Sheet Adhesives", ThreeBond Technical News, Issued Jul. 1, 2009, 8 pages.

Chang, "Lasers Make Other Metals Look Like Gold", New York Times, nytimes.com, 2 pgs., Jan. 31, 2008.

"Database EPI" Week 201107 Thomas Scientific, London, GB; AN 2010-Q46184, Nov. 17, 2010, 1 pg.

First Office Action for Chinese Patent Application 200980149217.6, mailed Jun. 13, 2013.

Restriction Requirement for U.S. Appl. No. 12/475,597, mailed Sep. 15, 2011.

Office Action for U.S. Appl. No. 12/475,597, mailed Nov. 29, 2011.

Office Action for U.S. Appl. No. 12/475,597, mailed Jun. 19, 2012.

Notice of Allowance for U.S. Appl. No. 12/475,597, mailed Nov. 14, 2012.

Second Office Action for Chinese Patent Application 200980149217.6, mailed Jan. 2, 2014.

Office Action for Chinese Patent Application No. 200980149217.6, mailed May 5, 2014.

European Search Report for EP Patent Application No. 14162918.8, mailed May 30, 2014.

"DP2UV Basic System 2 W", ROBA Technology + Services GmbH, Aug. 2008, 2 pgs.

Office Action for Chinese Application No. 200980149217.6, mailed Oct. 24, 2014.

\* cited by examiner

US 9,185,835 B2

TECHNIQUES FOR MARKING PRODUCT HOUSINGS

CROSS-REFERENCE TO RELATED APPLICATIONS

This application is a divisional application of U.S. patent application Ser. No. 12/475,597, filed May 31, 2009, and entitled "Techniques for Marking Product Housings," which is hereby incorporated herein by reference.

This application, via U.S. patent application Ser. No. 12/475,597, claims priority to U.S. Provisional Patent Application No. 61/059,789, filed Jun. 8, 2008, and entitled "Methods and Systems for Manufacturing an Electronic Device," which is hereby incorporated herein by reference.

This application, via U.S. patent application Ser. No. 12/475,597, claims priority to U.S. Provisional Patent Application No. 61/121,491, filed Dec. 10, 2008, and entitled "Techniques for Marking Product Housings," which is hereby incorporated herein by reference.

BACKGROUND OF THE INVENTION

1. Field of the Invention

The present invention relates to marking products and, more particularly, marking outer housing surfaces of electronic devices.

2. Description of the Related Art

Consumer products, such as electronic devices, have been marked with different information for many years. For example, it is common for electronic devices to be marked with a serial number, model number, copyright information and the like. Conventionally, such marking is done with an ink printing or stamping process. Although conventional ink printing and stamping is useful for many situations, such techniques can be inadequate in the case of handheld electronic devices. The small form factor of handheld electronic devices, such as mobile phones, portable media players and Personal Digital Assistants (PDAs), requires that the marking be very small. In order for such small marking to be legible, the marking must be accurately and precisely formed. Unfortunately, however, conventional techniques are not able to offer sufficient accuracy and precision. Thus, there is a need for improved techniques to mark products.

SUMMARY

The invention pertains to techniques or processes for providing markings on products. The markings provided on products can be textual and/or graphic. The techniques or processes can provide high resolution markings on surfaces that are flat or curved. In one embodiment, the products have housings and the markings are to be provided on the housings. For example, the housing for a particular product can include an outer housing surface and the markings can be provided on the outer housing surface.

In general, the markings, or annotations, provided on products according to the invention can be textual and/or graphic. The markings can be used to provide a product (e.g., a product's housing) with certain information. The marking can, for example, be use to label the product with various information. When a marking includes text, the text can provide information concerning the product (e.g., electronic device). For example, the text can include one or more of: name of product, trademark or copyright information, design location, assembly location, model number, serial number, license number, agency approvals, standards compliance, electronic codes, memory of device, and the like). When a marking includes a graphic, the graphic can pertain to a logo, a certification mark, standards mark or an approval mark that is often associated with the product. The marking can be used for advertisements to be provided on products. The markings can also be used for customization (e.g., user customization) of a housing of a product.

One aspect described herein provides product marking using photolithography. Here, intermediate material can be adhered to a product surface, then patterned, and then material that is to be used for marking can deposited onto the product surface. Subsequently, any remaining intermediate material can be removed (along with any intermediate material) such that the product thereafter includes the text and/or graphics for the product marketing Another aspect described herein provides product marking using ablation. Here, material that is to be used for marking is deposited onto a product surface and then ablated to yield the text and/or graphics for the product marketing.

The invention can be implemented in numerous ways, including as a method, system, device, or apparatus. Several embodiments of the invention are discussed below.

As a method for depositing material to selected regions of an electronic device housing, one embodiment of the invention can, for example, include at least: adhering a photoresist layer to a housing surface of the electronic device housing; positioning a masking film over the photoresist layer that is adhered to the housing surface, the masking film including a predetermined pattern; exposing the masking film and the photoresist layer to radiation, thereby exposing a portion of the photoresist layer in accordance with the predetermined pattern; removing the masking film from proximity of the photoresist layer; removing the portion of the photoresist layer that has been exposed; depositing a layer of material onto the housing surface, the layer of material being provided on the housing surface where the portion of the photoresist layer has been removed and being provided on a remaining portion of the photoresist layer; and removing the remaining portion of the photoresist layer and the portion of the layer of material provided on the remaining portion of the photoresist layer, thereby retaining the layer of material on the housing surface in accordance with the predetermined pattern.

As a method for depositing material to selected regions of an electronic device housing, another embodiment of the invention can, for example, include at least: forming a mask layer having at least one predetermined opening; adhering the mask layer to an housing surface of the electronic device housing; depositing a layer of material onto the housing surface, the layer of material being provided on the housing surface at least within the predetermined opening of the mask layer; removing the mask layer from the outer surface housing; and removing select portions of the layer of material that are not desired to remain on the outer surface housing.

As a method for depositing material to selected regions of an electronic device housing, another embodiment of the invention can, for example, include at least: depositing a layer of material onto an housing surface of the electronic device housing; and performing laser ablation of select portions of the layer of material on the housing surface to thereby remove the select portions of the of the layer of material that are not desired to remain on the outer surface housing.

As a method for depositing material to selected regions of an electronic device housing, still another embodiment of the invention can, for example, include at least: forming a mask on a housing surface of the electronic device housing, the mask having a predetermined pattern; depositing a layer of material onto the housing surface, the layer of material being provided on the housing surface where the mask has openings; and subsequently removing the mask from the housing surface, thereby retaining the layer of material on the housing surface in accordance with the predetermined pattern.

Other aspects and advantages of the invention will become apparent from the following detailed description taken in conjunction with the accompanying drawings which illustrate, by way of example, the principles of the invention.

BRIEF DESCRIPTION OF THE DRAWINGS

The invention will be readily understood by the following detailed description in conjunction with the accompanying drawings, wherein like reference numerals designate like structural elements, and in which.

DETAILED DESCRIPTION OF EMBODIMENTS
OF THE INVENTION

The invention pertains to techniques or processes for providing markings on products. The markings provided on products can be textual and/or graphic. The techniques or processes can provide high resolution markings on surfaces that are flat or curved. In one embodiment, the products have housings and the markings are to be provided on the housings. For example, the housing for a particular product can include an outer housing surface and the markings can be provided on the outer housing surface.

In general, the markings, or annotations, provided on products according to the invention can be textual and/or graphic. The markings can be used to provide a product (e.g., a product's housing) with certain information. The marking can, for example, be use to label the product with various information. When a marking includes text, the text can provide information concerning the product (e.g., electronic device). For example, the text can include one or more of: name of product, trademark or copyright information, design location, assembly location, model number, serial number, license number, agency approvals, standards compliance, electronic codes, memory of device, and the like). When a marking includes a graphic, the graphic can pertain to a logo, a certification mark, standards mark or an approval mark that is often associated with the product. The marking can be used for advertisements to be provided on products. The markings can also be used for customization (e.g., user customization) of a housing of a product.

Embodiments of the invention are discussed below with reference to FIGS. 1-6B. However, those skilled in the art will readily appreciate that the detailed description given herein with respect to these figures is for explanatory purposes as the invention extends beyond these limited embodiments.

One aspect described herein provides product marking using photolithography. Here, an intermediate material can be adhered to a product surface, then patterned, and then material that is to be used for marking can deposited onto the product surface. Subsequently, any remaining intermediate material can be removed (along with any of the material used for marking that is provided therein) such that the product thereafter includes the text and/or graphics for the product marketing in accordance with the patterned intermediate material.

Figure 1:
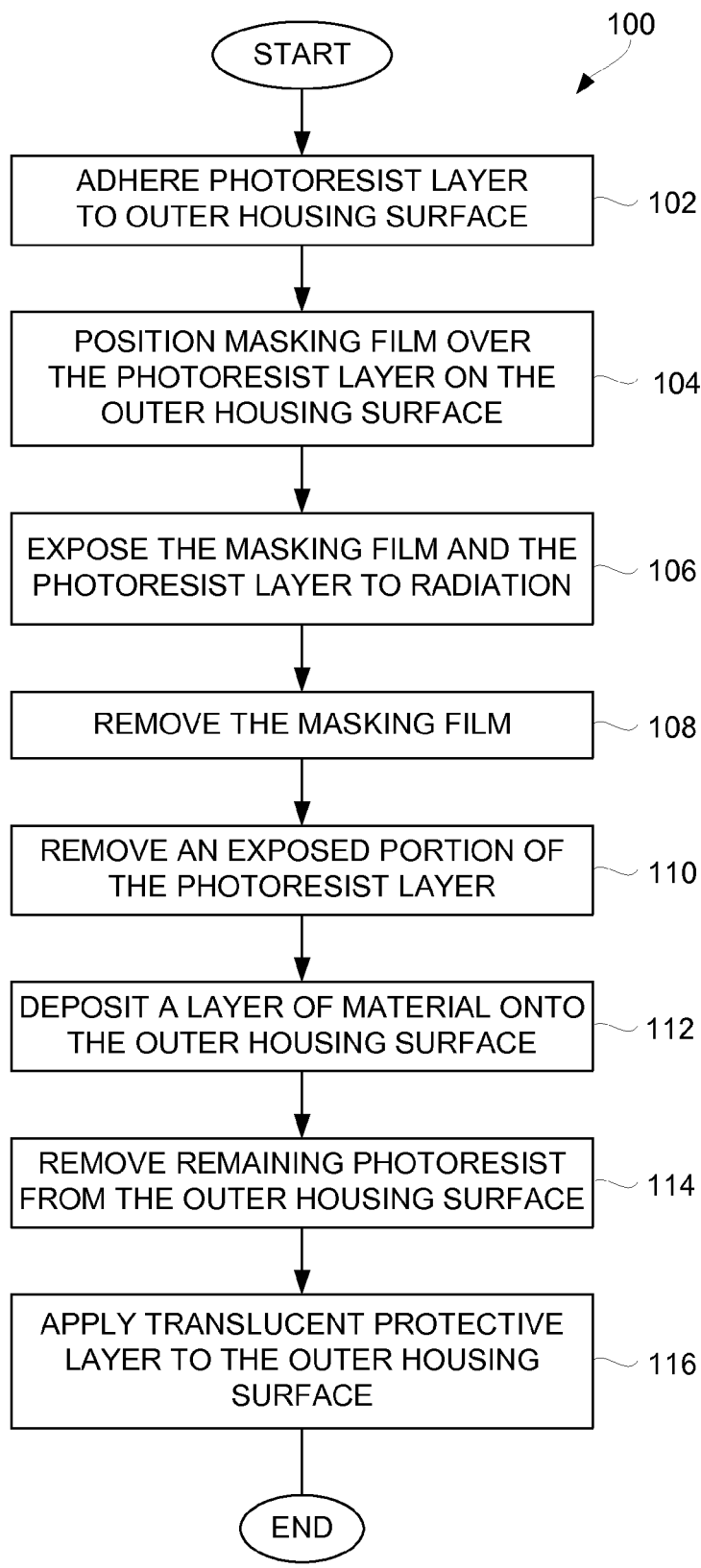
FIG. 1 is a process flow diagram for product marking process according to one embodiment of the invention.

FIG. 1 is a process flow diagram for product marking process 100 according to one embodiment of the invention. The product marking process 100 is, for example, suitable for applying text or graphics to a housing surface (e.g., an outer housing surface) of an electronic device. The product marking process 100 is, in one embodiment, particularly well-suited for applying text and/or graphics to an outer housing surface of a handheld electronic device. Examples of handheld electronic devices include mobile telephones (e.g., cell phones), Personal Digital Assistants (PDAs), portable media players, remote controllers, pointing devices (e.g., computer mouse), game controllers, etc.

The product marking process 100 operates to mark an outer housing surface of an electronic device. The product marking process 100 is a multi-step process to form high resolution text or graphics onto the outer housing surface. The outer housing surface can be flat or curved.

Initially, the product marking process 100 adheres 102 a photoresist layer to an outer housing surface. In effect, the photoresist layer is laminated against the outer housing surface (since the outer housing surface is to carry the marking). In one implementation, to ensure that the photoresist layer is tightly sealed against the outer housing surface (at least in the area being processed), one or more heated, conformable rollers can be used to apply heat and pressure. The conformable nature of the one or more roller is advantageous when the outer housing surface is curved. In this embodiment, the masking film can be a dry film photoresist. In an alternative embodiment, the masking film can be a wet film photoresist, which can be positioned 104 on the photoresist layer using spin-coating.

Next, a masking film can be positioned 104 over the photoresist layer on the outer housing surface. The masking film and the photoresist later can then be exposed 106 to radiation. For example, the radiation can be ultraviolet (UV) radiation that is used to activate portions of the photoresist layer. More particularly, the masking film has a predetermined pattern for the text or graphics to be applied to the outer housing surface. Hence, by applying the masking film over at the photoresist layer, only selected portions of the photoresist layer are activated by the radiation. In other words, the masking film allows the radiation to pass through to activate the photoresist layer in only the selected portions which pertain to the predetermined pattern. For example, the predetermined pattern of the masking film can be considered an inverse stencil in that is serves to block the radiation in regions where marking is not to be provided. In one implementation, the masking film can be a silver-halide thin film.

Next, the masking film can be removed 108. Further, an exposed (i.e., activated) portion of the photoresist layer can be removed 110. The removal of the photoresist layer by performed by a chemical washing operation. In one implementation, the chemical washing can use a potassium carbonate or sodium carbonate solution.

Thereafter, a layer of material can be deposited 112 onto the outer housing surface. For example, the layer of material can be deposited 112 by a deposition process, such as sputtering. One suitable process for the deposition of the layer of material is a Physical Vapor Deposition (PVD) process. The layer of material being deposited can very depending upon application. However, one suitable layer of material is a layer of metal, such as silver. Alternatively, the layer of material can be a layer of tin or other material that can be applied with a deposition process.

Next, any remaining photoresist can be removed 114 from the outer housing surface. The layer of material that is deposited on the remaining photoresist is also removed as the underlying photoresist is removed. The removal of the photoresist layer by performed by a chemical washing operation. In one implementation, the chemical washing can use a relatively weak solution of sodium hydroxide (NaOH).

Thereafter, if desired, a translucent protective layer can be applied 116 to the outer housing surface so as to cover and protect the remaining layer of material that provides the graphical elements and/or textual elements on the outer housing surface that serve to mark the product. For example, the translucent protective layer can be a layer of acrylic. Following the block 116, the product marking process 100 can end.

In one embodiment, at least a portion of product housing can be formed of a plastic or resin, such as polycarbonate. The marking can use a material that is metal (e.g., silver), which can be reflective. The resulting marking on the product housing is thus able to be provided in high resolution on a product's housing.

In one particular embodiment, the processing parameters for one suitable implementation can, for example, be as follows:

Lamination of a photoresist layer to a housing surface
Lamination speed: 53 rpm
Laminating temp: 100 degrees Celsius
Lamination pressure: 5 Kg/cm2
Roller hardness: ≤68
Pressure uniformity
Roller cleaning (with Isopropyl Alcohol), e.g., to prevent press in dents
Exposure
Exposure Energy: 78 mj/cm2
Resist: 1 (e.g., in case of a white housing)
Main vacuum: <-700 KPa
Phototool Dmax: >4.5
Phototool: No Emulsion Protective Layer
Exposure vacuum foil: Using clear film Polyethylene Teraphthalate (PET)
Change white light to yellow light
Avoid scratch and cleaning tray
Avoid paint and protect rustiness using tape
Cleaning and stick roller
Developing
Sodium carbonate: 0.8%~0.9%
Break point: 50%~60%
Pressure: 1.8 Kg/cm2
Speed: 4.7 m/min (3 dev chamber)
Hard Water rinse: 200-250 ppm
Rinse (e.g., de-ionized water rinse
Stripping
1. Sputter silver (Thickness 20 nm)
Sodium hydroxide: 1.5%
Solution temperature: 50 degrees Celsius
Stripping time: 5'40"~6'
Stripping time can be reduced with other solutions
2. Sputter Aluminum (Thickness 50 nm)

FIGS. 2A-2H are diagrams detailing a product marking process according to one embodiment of the invention. The product marking process shown in FIGS. 2A-2H pertains to one embodiment of the product marking process 100 illustrated in FIG. 1.

Figure 2A:
FIGS. 2A-2H are diagrams detailing a product marking process according to one embodiment of the invention.

FIG. 2A is a diagram illustrating a housing portion 200. The housing portion 200 can represent a portion of a product housing, such as an outer housing of an electronic device.

Figure 2B:

FIG. 2B is a diagram illustrating the housing portion 200 having a photoresist layer 202 applied thereon.

Figure 2C:
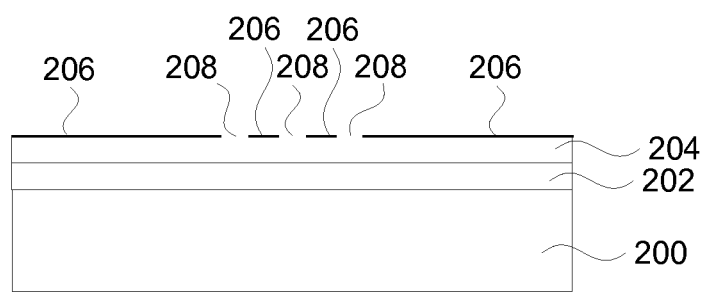

FIG. 2C is a diagram illustrating a masking film 204 applied over the photoresist layer 202 on the housing portion 200. The masking film 204 includes opaque sections 206 and translucent sections 208. The translucent sections 208 can provide a predetermined pattern for marking of the product housing.

Figure 2D:
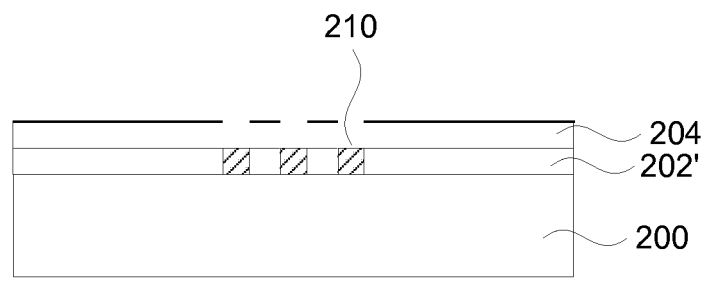

FIG. 2D is a diagram illustrating the housing portion 200 after having been exposed to radiation. For example, ultraviolet (UV) radiation can be directed at the photoresist layer 202 on the housing portion 200 through the masking film 204. As a result, the exposed photoresist layer 202' includes exposed photoresist regions 210 below the translucent sections 208 in the masking film 204.

Figure 2E:
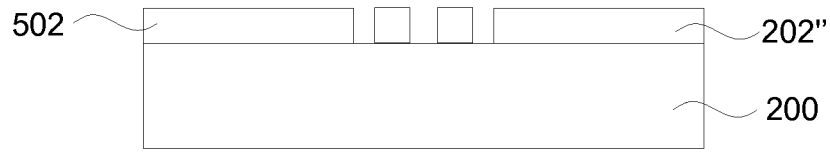

FIG. 2E is a diagram illustrating the housing portion 200 having the remaining photoresist layer 202". Here, the remaining photoresist layer 202" results from removal of the masking film 204 and those regions 211 of the photoresist layer 202' that were activated by the exposure to radiation.

Figure 2F:
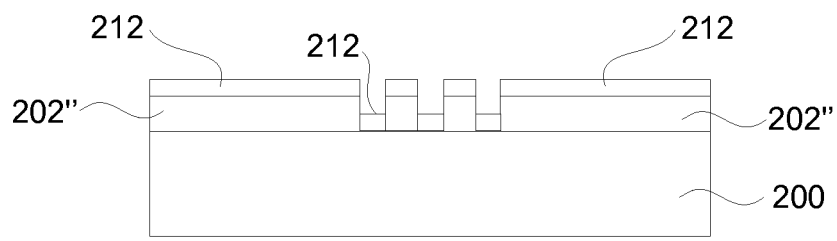

FIG. 2F is a diagram illustrating the housing portion 200 after a layer of material 212 is applied over the remaining photoresist layer 202". The layer of material 212 is applied not only over the remaining portion of the photoresist layer 202" but also directly over the outer surface of the housing portion 200 where the photoresist layer 202 has been removed. The layer of material 212 can, for example, be applied through a sputtering technique, such as through Physical Vapor Deposition (PVD). Also, as an example, the layer of material can be a metal.

Figure 2G:
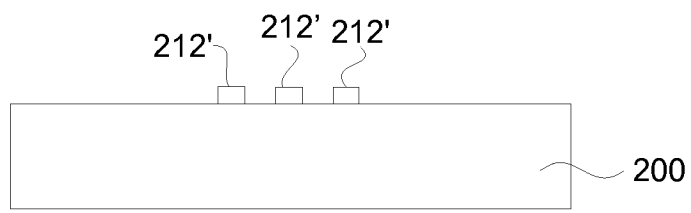

FIG. 2G is a diagram illustrating the housing portion 200 after the remaining photoresist layer 202" is removed. Here, the layer of material 212 applied over the remaining portion of the photoresist layer 202" is also removed. However, the portion of the layer of material 212' that remains is that portion that has been provided directly over the outer surface of the housing portion 200.

Figure 2H:
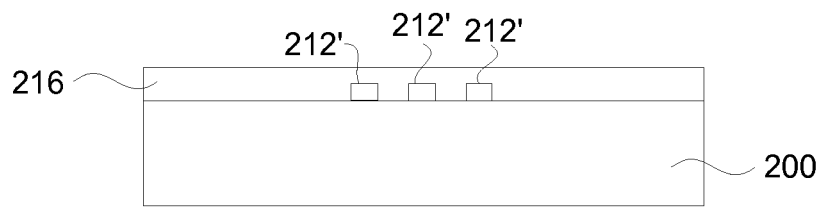

FIG. 2H is a diagram illustrating the housing portion 200 after a protective coating 216 is applied on the outer surface of the housing portion 200 over the remaining portion of the layer of material 212'.

FIGS. 3A-3H are diagrams detailing a product marking process according to another embodiment of the invention. The product marking process shown in FIGS. 3A-3H pertains to one embodiment of the product marking process 100 illustrated in FIG. 1.

Figure 3A:
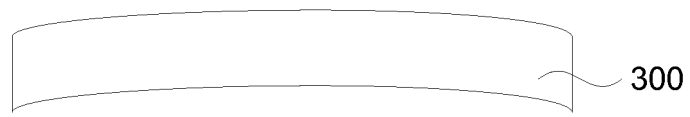
FIGS. 3A-3H are diagrams detailing a product marking process according to another embodiment of the invention.

FIG. 3A is a diagram illustrating a housing portion 300. The housing portion 300 can represent a portion of a product housing, such as an outer housing of an electronic device. In this embodiment, the housing portion 300 is curved. Marking is rendered more complicated when the surface to be marked has curvature. However, the product marking process according to the invention is suitable for use on flat, curved or complex surfaces.

Figure 3B:

FIG. 3B is a diagram illustrating the housing portion 300 having a photoresist layer 302 applied thereon.

Figure 3C:
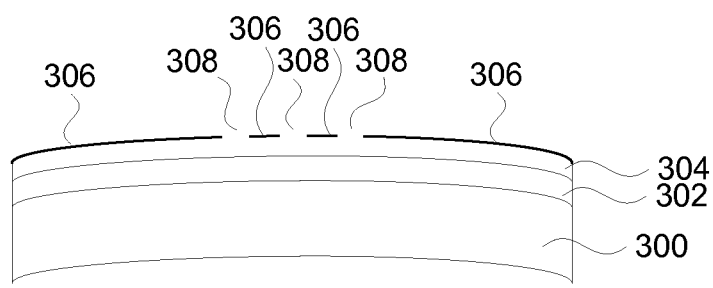

FIG. 3C is a diagram illustrating a masking film 304 applied over the photoresist layer 302 on the housing portion 300. The masking film 304 includes opaque sections 306 and translucent sections 308. The translucent sections 308 can provide a predetermined pattern for marking of the product housing.

Figure 3D:
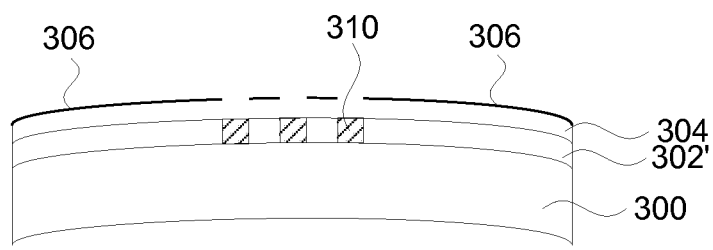

FIG. 3D is a diagram illustrating the housing portion 300 after having been exposed to radiation. For example, ultraviolet (UV) radiation can be directed at the photoresist layer 302 on the housing portion 300 through the masking film 304. As a result, the exposed photoresist layer 302' includes exposed photoresist regions 310 below the translucent sections 308 in the masking film 304.

Figure 3E:
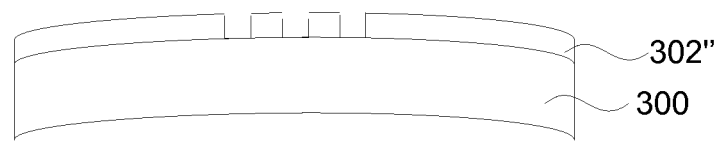

FIG. 3E is a diagram illustrating the housing portion 300 having the remaining photoresist layer 302''. Here, the remaining photoresist layer 302'' results from removal of the masking film 304 and those regions 311 of the photoresist layer 302' that were activated by the exposure to radiation.

Figure 3F:
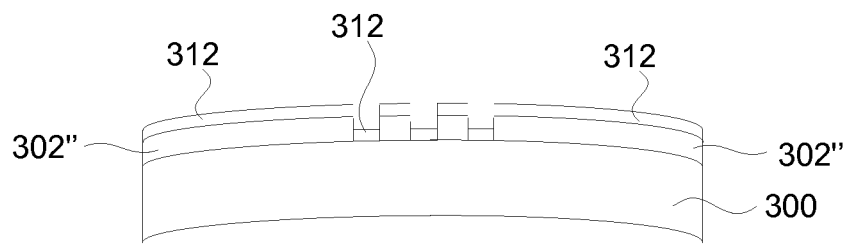

FIG. 3F is a diagram illustrating the housing portion 300 after a layer of material 312 is applied over the remaining photoresist layer 302''. The layer of material 312 is applied not only over the remaining portion of the photoresist layer 302'' but also directly over the outer surface of the housing portion 300 where the photoresist layer 302 has been removed. The layer of material 312 can, for example, be applied through a sputtering technique, such as through Physical Vapor Deposition (PVD). Also, as an example, the layer of material can be a metal.

Figure 3G:
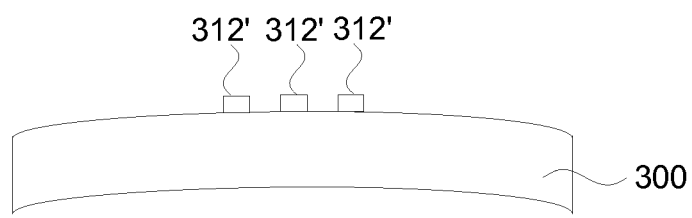

FIG. 3G is a diagram illustrating the housing portion 300 after the remaining photoresist layer 302'' is removed. Here, the layer of material 312 applied over the remaining portion of the photoresist layer 302'' is also removed. However, the portion of the layer of material 312' that remains is that portion that has been provided directly over the outer surface of the housing portion 300.

Figure 3H:
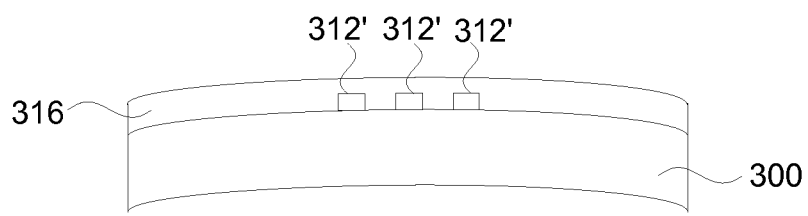

FIG. 3H is a diagram illustrating the housing portion 300 after a protective coating 316 is applied on the outer surface of the housing portion 300 over the remaining portion of the layer of material 312'.

In the product marking process 100 illustrated in FIG. 1, a photolithographic mask is used, where a photoresist layer is adhered to an outer surface housing. However, in other embodiment, a mask that performs a similar function can be formed from different techniques. As one example, a mask can be pad printed on the outer surface housing. As another example, a mask can be silk screened onto the outer surface housing. As still another example, a mask can be printed, such as with an ink jet printing device, onto the outer surface housing.

Another aspect described herein provides product marking using ablation. Here, material that is to be used for marking is deposited onto a product surface and then selectively ablated to yield the text and/or graphics for the product marketing.

Figure 4:
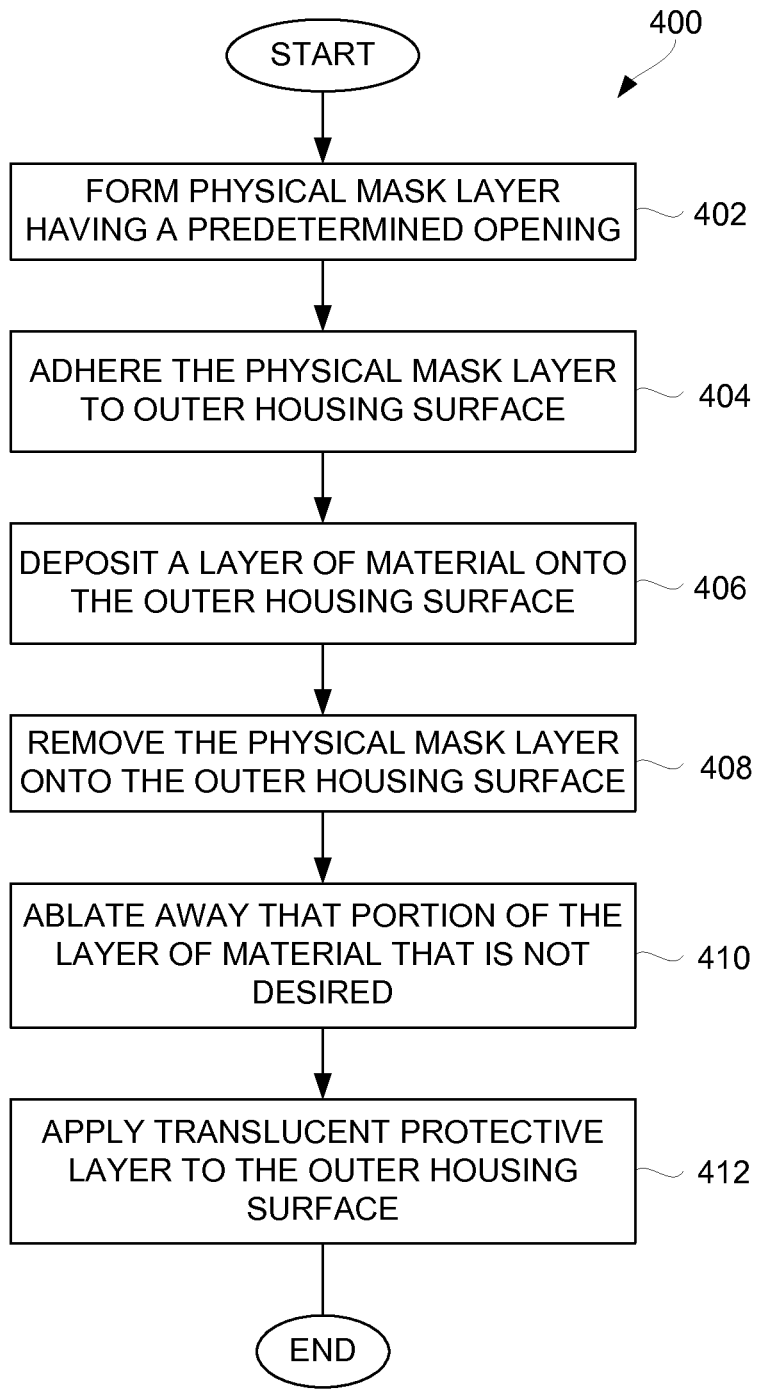
FIG. 4 is a process flow diagram for a product marking process according to another embodiment of the invention.

FIG. 4 is a process flow diagram for a product marking process 400 according to another embodiment of the invention. In this embodiment, the product marking process 400 can mark a housing of an electrical device. For example, the product marking process 400 can be used to form text and/or graphics onto a housing surface, such as an outer housing surface, of an electrical device.

The product marking process 410 initially forms 402 a physical mask layer having at least one predetermined opening. The predetermined opening is, for example, an opening that surrounds a region were text or graphics is to be applied to the outer housing surface. In other words, the predetermined opening is oversized as compared to the region where text or graphic is to be applied on the outer housing surface. The physical mask layer can be implemented by a film having at die cut for the predetermined opening. In the event that the physical mask layer has more than one predetermined opening, the physical mask layer can have a die cut for each of the predetermined openings.

After the physical mask has been formed 402, the physical mask layer can be adhered 404 to the outer housing surface. In one implementation, the physical mask layer can be adhered 404 to the outer housing surface through use of an adhesive. For example, the physical mask can have an adhesive backing.

Next, a layer of material can be deposited 406 onto the outer housing surface. For example, a deposition technique, such as sputtering, can be used to deposit 406 a layer of material onto the outer housing surface. In one implementation, the deposition technique uses a Physical Vapor Deposition (PVD) process. The layer of material being deposited 406 is the material that is to form the marking. For example, the layer of material can be a layer of metal, such as aluminum. Thereafter, the physical mask layer can be removed 408 from the outer housing surface.

After the physical mask layer has been removed 408, the product marking process 400 can ablate 410 away portions of the layer of material that are not desired. The ablation 410 can utilize a laser to precisely remove portions of the layer of material that has been deposited 406 onto the outer housing surface. The ablation 410 can thus form specific graphical elements and/or text elements into the layer of material by ablation 410 of those portions of the layer of material that are not needed to represent the desired graphical elements and/or textual elements that are to remain on the outer housing surface. In one implementation, the laser performing the ablation 410 is a YV04 laser (e.g., 1064 nanometer (NM)). Through proper control of the laser, the ablation 410 of undesired portion of the layer of material can be removed without damaging the surface of the outer surface housing.

Subsequently, a translucent protective layer can be applied 412 to the outer housing surface. Although the translucent protective layer is not required, the translucent protective layer can serve to protect the remaining portion of the layer of material that is used to represent the one or more desired graphical elements and/or textual elements on the outer housing surface. For example, the translucent protective layer can be a layer of acrylic. Following the block 412, the product marking process 400 can end.

It should be noted that the use of a physical mask in the product marking process 400 is optional. The physical mask serves to confine the area(s) where ablation is to be performed. Hence, in one embodiment, the product marking can be performed with simply operations 406 and 410 of the product marking process 400, though this entails additional ablation.

FIGS. 5A-5E are diagrams detailing a product marking process according to one embodiment of the invention. The product marking process shown in FIGS. 5A-5D pertains to one embodiment of the product marking process 400 illustrated in FIG. 4.

Figure 5A:
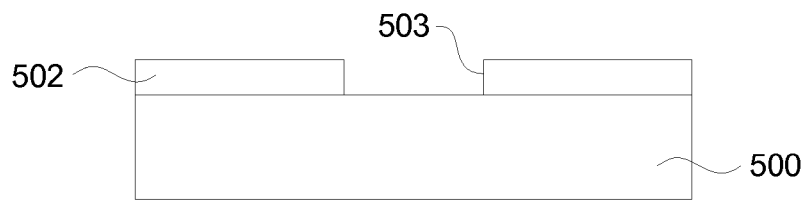
FIGS. 5A-5E are diagrams detailing a product marking process according to one embodiment of the invention.

FIG. 5A is a diagram illustrating a housing portion 500. The housing portion 500 can represent a portion of a product housing, such as an outer housing of an electronic device. A mask layer 502 is attached to the housing portion 500. The mask layer has at least one predetermined opening 503 that defines a region where marking of the outer housing is to be performed.

Figure 5B:
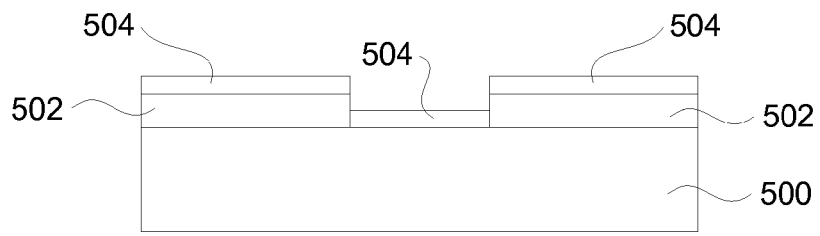

FIG. 5B is a diagram illustrating the housing portion 500 having the mask layer 502 as well as a layer of material 504. The layer of material 504 is applied over the predetermined opening 503 in the mask layer 502 and may also be applied over some or all of the mask layer 502.

Figure 5C:
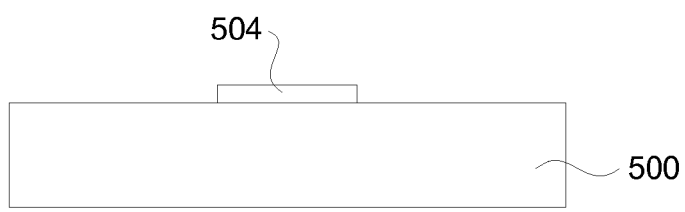

FIG. 5C is a diagram illustrating the housing portion 500 having a remaining portion of the layer of material 504 that results after the mask layer 502 is removed from the housing portion 500. The remaining portion of the layer of material 504 corresponds to the predetermined pattern.

Figure 5D:
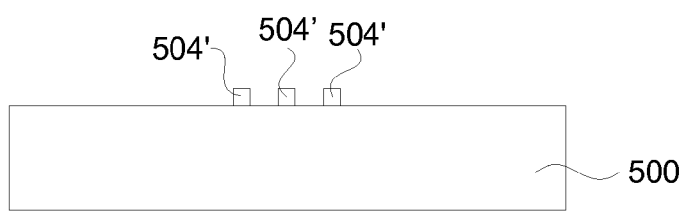

FIG. 5D is a diagram illustrating the housing portion 500 after the remaining portion of the layer of material 504 is abated to remove unwanted areas. As shown in FIG. 5D, after the ablation, the layer of material 504 is now converted to specific marking elements 504'. The specific marking elements 504' can pertain to text and/or graphic elements that are formed from the layer of material 504 using laser ablation.

Figure 5E:
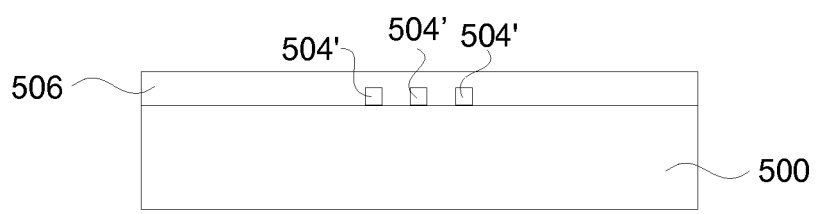

FIG. 5E is a diagram illustrating the housing portion 500 after a protective coating 506 is applied on the outer surface of the housing portion 500 over the specific marking elements 504' that have been formed in the layer of material 504.

Figure 6A:
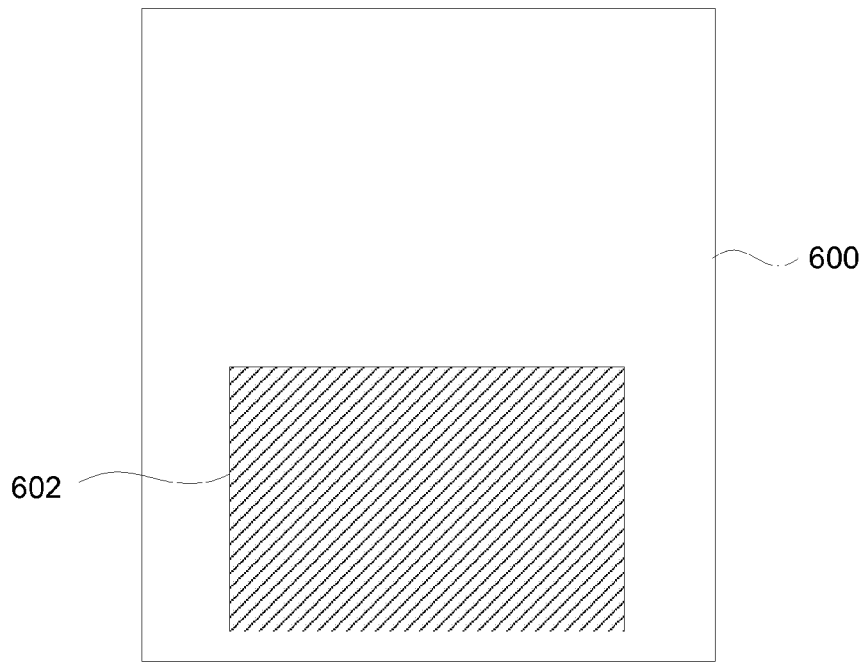
FIGS. 6A and 6B are diagrams illustrating exemplary marking of a product in accordance with a product marking process.
Figure 6B:
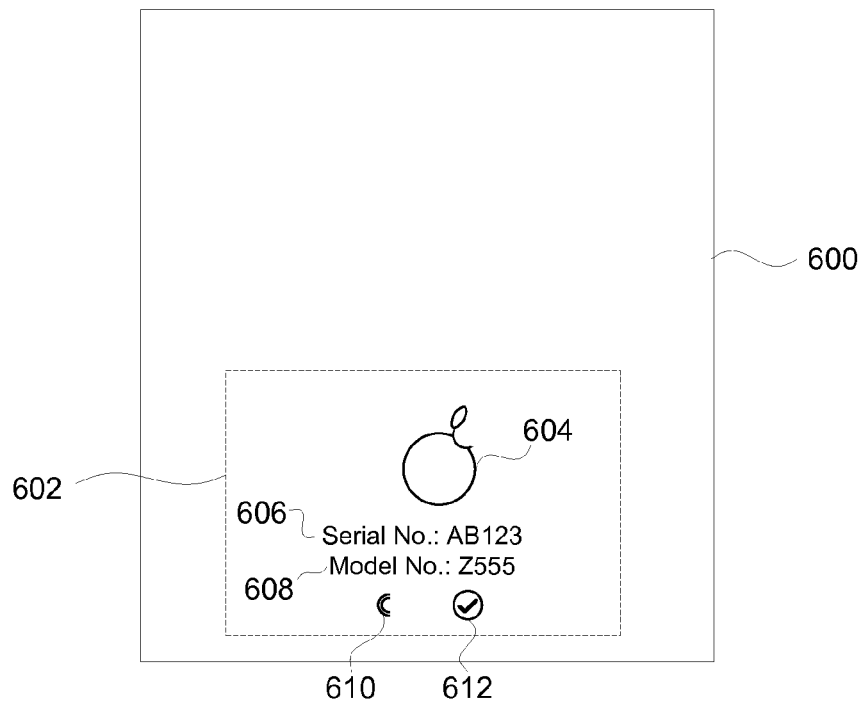

FIGS. 6A and 6B are diagrams illustrating exemplary marking of a product in accordance with a product marking process, such as the product marking process shown in FIGS. 5A-5E or the product marking process 400 illustrated in FIG. 4.

FIG. 6A illustrates a product housing 600 according to one embodiment. The product housing 600 being illustrated can represent one surface, such as back surface, of a handheld electronic device. A predetermined region 602 of the illustrated surface can be coated or covered with a layer of material to be used for marking. As noted above, a masking layer can be used to confine the layer of material to the predetermined region 602.

FIG. 6B illustrates the product housing 600 after the layer of material in the predetermined region 602 has been ablated away to yield the desired labeling. In this example, the labeling includes a logo graphic 604, serial number 606, model number 608, and certification/approval marks 610 and 612.

In one embodiment, the product marking techniques discussed herein can be used to provide markings on a portable electronic device. The portable electronic device can further be a hand-held electronic device. The term hand-held generally means that the electronic device has a form factor that is small enough to be comfortably held in one hand. A hand-held electronic device may be directed at one-handed operation or two-handed operation. In one-handed operation, a single hand is used to both support the device as well as to perform operations with the user interface during use. In two-handed operation, one hand is used to support the device while the other hand performs operations with a user interface during use or alternatively both hands support the device as well as perform operations during use. In some cases, the hand-held electronic device is sized for placement into a pocket of the user. By being pocket-sized, the user does not have to directly carry the device and therefore the device can be taken almost anywhere the user travels (e.g., the user is not limited by carrying a large, bulky and often heavy device).

Additional information on product marking as well as other manufacturing techniques and systems for electronic devices are contained in U.S. Provisional Patent Application No. 61/059,789, filed Jun. 8, 2008, and entitled "Methods and Systems for Manufacturing an Electronic Device," which is hereby incorporated herein by reference.

The various aspects, features, embodiments or implementations of the invention described above can be used alone or in various combinations.

Different aspects, embodiments or implementations may, but need not, yield one or more of the following advantages. One advantage is that high precision markings can be provided to product housings. As an example, the marking being provided can have a resolution whereby thirty (30) micron line widths can be achieved. Another advantage is that the marking techniques are effective for surfaces that are flat or curved. Another advantage is that the marking techniques have good adhesion characteristics to product housings, such as plastic housings. Still another advantage is that markings can be formed that are metallic and reflective for superior visual appearance. Yet still another advantage is that one or several markings can be provided to one or more distinct areas of a product's housing. The various markings can be efficiently provided in a sequential or concurrent manner.

The many features and advantages of the present invention are apparent from the written description. Further, since numerous modifications and changes will readily occur to those skilled in the art, the invention should not be limited to the exact construction and operation as illustrated and described. Hence, all suitable modifications and equivalents may be resorted to as falling within the scope of the invention.

What is claimed is:

1. A method for depositing material to selected regions of an electronic device housing, said method comprising:
   adhering a photoresist layer to a housing surface of the electronic device housing;
   positioning a masking film over the photoresist layer that is adhered to the housing surface, the masking film including a predetermined pattern;
   exposing the masking film and the photoresist layer to radiation, thereby exposing a portion of the photoresist layer in accordance with the predetermined pattern;
   removing the masking film from proximity of the photoresist layer;
   removing the portion of the photoresist layer that has been exposed;
   depositing a layer of material onto the housing surface, the layer of material being provided on the housing surface where the portion of the photoresist layer has been removed and being provided on a remaining portion of the photoresist layer; and
   removing the remaining portion of the photoresist layer and the portion of the layer of material provided on the remaining portion of the photoresist layer, thereby retaining the layer of material on the housing surface in accordance with the predetermined pattern,
   wherein the layer of material is a layer of metal, and
   wherein the layer of material retained on the housing surface in accordance with the predetermined pattern serves to mark the housing surface of the electronic device housing.

2. A method as recited in claim 1, wherein the predetermined pattern is transparent in the selected regions where the material is to be deposited.

3. A method as recited in claim 1, wherein the photoresist layer includes at least a UV photoresist material, and wherein the radiation is UV radiation.

4. A method as recited in claim 1, wherein said method further comprises:
   subsequently applying a translucent protective layer to the housing surface.

5. A method as recited in claim 1, wherein the material retained on the housing surface in the predetermined pattern includes text and graphics.

6. A method as recited in claim 1, wherein the material retained on the housing surface in the predetermined pattern includes at least one graphic, the at least one graphic being a logo, a certification mark or an approval mark.

7. A method as recited in claim 1, wherein the layer of material is applied by Physical Vapor Deposition.

8. A method as recited in claim 7, wherein the layer of metal is a layer of silver.

9. A method as recited in claim 1, wherein the housing surface is an outer housing surface.

10. A method as recited in claim 1, wherein at least the portion of the housing surface of the electronic device housing being marked has a curvature.

11. A method as recited in claim 1, wherein the electronic device housing is a handheld, portable electronic device, and wherein the housing surface is an outer housing surface.

12. A method as recited in claim 11, wherein the material retained on the housing surface in the predetermined pattern includes text and graphics.

13. A method as recited in claim 11, wherein the material retained on the housing surface in the predetermined pattern includes at least one graphic, the at least one graphic being a logo, a certification mark or an approval mark.

14. A method as recited in claim 11, wherein the layer of material is applied by Physical Vapor Deposition (PVD).

15. A method for depositing material to selected regions of an electronic device housing, said method comprising:
  adhering a photoresist layer to a housing surface of the electronic device housing;
  positioning a mask over the photoresist layer that is adhered to the housing surface, the mask including a predetermined pattern;
  exposing the mask and the photoresist layer to radiation, thereby exposing a portion of the photoresist layer in accordance with the predetermined pattern;
  removing the mask from proximity of the photoresist layer;
  removing the portion of the photoresist layer that has been exposed;
  depositing a layer of material onto the housing surface, the layer of material being provided on the housing surface where the portion of the photoresist layer has been removed and being provided on a remaining portion of the photoresist layer; and
  removing the remaining portion of the photoresist layer and the portion of the layer of material provided on the remaining portion of the photoresist layer, thereby retaining the layer of material on the housing surface in accordance with the predetermined pattern,
  wherein the layer of material retained on the housing surface in accordance with the predetermined pattern serves to mark the housing surface of the electronic device housing, and
  wherein the electronic device housing is a handheld, portable electronic device.

16. A method as recited in claim 15, wherein the electronic device housing is a handheld, portable electronic device, and wherein the housing surface is an outer housing surface.

17. A method as recited in claim 16, wherein the material retained on the housing surface in the predetermined pattern includes text and graphics.

18. A method as recited in claim 16, wherein the material retained on the housing surface in the predetermined pattern includes at least one graphic, the at least one graphic being a logo, a certification mark or an approval mark.

19. A method as recited in claim 16, wherein the layer of material is applied by Physical Vapor Deposition (PVD).

20. A method for depositing material to selected regions of an electronic device housing, said method comprising:
  adhering a photoresist layer to a housing surface of the electronic device housing;
  positioning a mask over the photoresist layer that is adhered to the housing surface, the mask including a predetermined pattern;
  exposing the mask and the photoresist layer to radiation, thereby exposing a portion of the photoresist layer in accordance with the predetermined pattern;
  removing the mask from proximity of the photoresist layer;
  removing the portion of the photoresist layer that has been exposed;
  depositing a layer of material onto the housing surface using Physical Vapor Deposition (PVD), the layer of material being provided on the housing surface where the portion of the photoresist layer has been removed and being provided on a remaining portion of the photoresist layer; and
  removing the remaining portion of the photoresist layer and the portion of the layer of material provided on the remaining portion of the photoresist layer, thereby retaining the layer of material on the housing surface in accordance with the predetermined pattern.

21. A method as recited in claim 20, wherein the layer of material retained on the housing surface in accordance with the predetermined pattern serves to mark the housing surface of the electronic device housing.

22. A method as recited in claim 21, wherein the electronic device housing is a handheld, portable electronic device, and wherein the housing surface is an outer housing surface.

23. A method as recited in claim 22, wherein the material retained on the housing surface in the predetermined pattern includes text and graphics.

24. A method as recited in claim 22, wherein said method further comprises:
  subsequently applying a translucent protective layer to the housing surface.

25. A method as recited in claim 22, wherein the material retained on the housing surface in the predetermined pattern includes at least one graphic, the at least one graphic being a logo, a certification mark or an approval mark.

26. A method as recited in claim 22, wherein the layer of material is a layer of metal.

* * * * *